(12) United States Patent
Plusquellic

(10) Patent No.: US 7,043,389 B2
(45) Date of Patent: May 9, 2006

(54) METHOD AND SYSTEM FOR IDENTIFYING AND LOCATING DEFECTS IN AN INTEGRATED CIRCUIT

(76) Inventor: James Francis Plusquellic, 7569 Murray Hill Rd., Apt. 231, Columbia, MD (US) 21046

( * ) Notice: Subject to any disclaimer, the term of this patent is extended or adjusted under 35 U.S.C. 154(b) by 58 days.

(21) Appl. No.: 10/782,256

(22) Filed: Feb. 18, 2004

(65) Prior Publication Data
US 2005/0182584 A1    Aug. 18, 2005

(51) Int. Cl.
*G06F 19/00* (2006.01)
(52) U.S. Cl. ........................ 702/117; 438/106
(58) Field of Classification Search ............ 702/117, 702/118, 64, 182–185, 188; 438/106
See application file for complete search history.

(56) References Cited

U.S. PATENT DOCUMENTS 6,496,028 B1    12/2002 Manhaeve et al.
6,833,724 B1 *  12/2004 Binkley et al. ............ 324/765

* cited by examiner

*Primary Examiner*—Edward Raymond
(74) *Attorney, Agent, or Firm*—Birdwell & Janke, LLP

(57) ABSTRACT

A method and system for detecting and locating defects in an integrated circuit. A time-varying input signal is applied to the integrated circuit, power signals produced at a plurality of respective ordered connections in response to the input signal are measured, and one or more defects in the integrated circuit are identified from the power signals so measured. A system is provided having a probe for connecting to the die of an integrated circuit prior to final packaging, a testing system for applying transient input signals to the die and acquiring die power signal measurements in response thereto, and a data processor for determining whether the power signal measurements indicate the presence of a defect in the die. Also provided is a method for reducing the effect of contact resistance from test probe connections. As a way of implementing the approach of the method and system there is also provided an integrated circuit having a plurality of ordered connections to the power grid and a plurality of calibration circuits associated with respective ordered connections so as to selectively inject transient signals onto the power grid at respective locations.

37 Claims, 12 Drawing Sheets

METHOD AND SYSTEM FOR IDENTIFYING AND LOCATING DEFECTS IN AN INTEGRATED CIRCUIT

BACKGROUND OF THE INVENTION

This invention relates to production testing of integrated circuits, particularly production testing of a completed but unpackaged circuit die by measuring the current drawn by the circuit at a plurality of power nodes, to determine whether the circuit is defective or not.

Integrated circuits typically comprise a semiconductor substrate on which several component layers have been formed to produce a large number of laterally-distributed transistors and other circuit devices. Additional connection layers are formed on top of the component layers to provide interconnections among and power to the circuit devices, and input and output signal connections to the devices. Power is typically delivered to the devices by a grid of power conductors which pass through the conduction layers to the devices periodically and terminate at pads disposed on the top layer of the die, thereby minimizing the resistance encountered by the current. Also, typically, the pads alternate between power pads and ground pads, the input and output signal pads being interspersed among the power and ground pads. Thus, an integrated circuit can be somewhat likened architecturally to a multi-story office building, where the circuit devices are on the ground floor, the interconnections between the devices are made by the upper floors, the power connections are made between the ground floor and the roof by an interconnected lattice of support columns, and additional columns are provided for input and output signal connections between the ground floor and the roof.

An integrated circuit as described above is known as a "die." Prior to distribution and use, a die is ordinarily placed in a hermetically-sealed package having pins or bumps for providing power, input and output connections to the circuit. As packaging adds significant cost to the final product, the die is ordinarily tested after fabrication is completed but before packaging to determine whether it is defective, in which case it is not packaged.

One known way to test a die is to measure the total quiescent current drawn by all of the power connection pads. If the total quiescent current significantly exceeds the maximum expected amount, then it can be concluded that the circuit has an internal short and is, therefore, defective. Another way to test a die is to measure the total current drawn by all of the power connection pads as a sequence of different input signal vectors is applied. An input vector is an ordered set of signals supplied to respective input signal connections. If the total current is significantly more or less than that expected for a given input vector, then it may be concluded that the circuit is defective, due either to a short or an open circuit. A third way to test a die is to measure the quiescent current at a plurality of power connection pads, thereby enabling the detection and localization of a shorting defect. To accomplish this, a calibration circuit must be embedded in the integrated circuit. These tests are described in C. Patel, E. Staroswiecki, S. Pawar, D. Acharyya and J. Plusquellic, "Diagnosis using Quiescent Signal Analysis on a Commercial Power Grid," International Symposium for Testing and Failure Analysis, pp. 713–722, 2002 (Pheonix, Ariz.).

While quiescent current measurements can be used to identify and locate some types of defects, other types of defects do not manifest in the steady state currents of quiescent measurements. Accordingly, an improved, more comprehensive testing procedure and apparatus would be desirable. In addition, it would be desirable to take into account the manufacturing and testing variability that occurs with power supply current testing so as to identify and locate defects more accurately.

SUMMARY OF THE INVENTION

In light of the foregoing, an approach for testing an integrated circuit having a power grid and a plurality of ordered connections to the power grid has been created according to the present invention. The approach provides a method comprising applying a time-varying input signal to the integrated circuit, measuring power signals produced at a plurality of respective ordered connections in response to the input signal, and identifying from the power signals so measured one or more defects in the integrated circuit.

The approach also provides a probe for connecting to the die of an integrated circuit prior to final packaging, a testing system for applying input signals to the die and acquiring die power signal measurements in response thereto, and a data processor for determining whether the power signal measurements indicate the presence of a defect in the die.

There is further provided a method for reducing the effect of contact resistance from test probe connections, comprising determining a first array of reference calibration power signal values for a reference device, determining a second array of test device power signal values for the integrated circuit under test, inverting the second array and multiplying it times the first array to produce a third, transformation array, and multiplying the measured test power signal values, produced under a subsequent set of logic tests, times the transformation array prior to identifying defects.

As a way of implementing the approach of the present invention there is also provided an integrated circuit, comprising a plurality of signal processing circuit components disposed on a substrate, a power grid for supplying power to the signal processing circuit components, and having a plurality of ordered connections to the power grid, and a plurality of calibration circuits associated with respective ordered connections so as to selectively inject transient signals onto the power grid at respective locations.

It is to be understood that this summary is provided as a means of generally determining what follows in the drawings and detailed description of the invention and is not intended to limit the scope of the invention. Moreover, the objects, features and advantages of the invention will be more fully understood upon consideration of the following detailed description of the invention taken in conjunction with the accompanying drawings.

DETAILED DESCRIPTION OF THE INVENTION

The present invention comprises a method and system for testing integrated circuits ("IC"s), particularly large-scale digital ICs, during production, after the circuit die, or chip, has been fabricated but before it is packaged. The invention takes advantage of the dynamic response of the power grid of the IC device under test ("DUT") both to determine whether the DUT is defective and, if so, to locate the defect. To provide useful terminology and to assist in understanding the description of the invention herein, it is useful first to describe some pertinent features of a typical IC that the invention may be used to test.

1. Typical Integrated Circuit Structure

Figure 1:
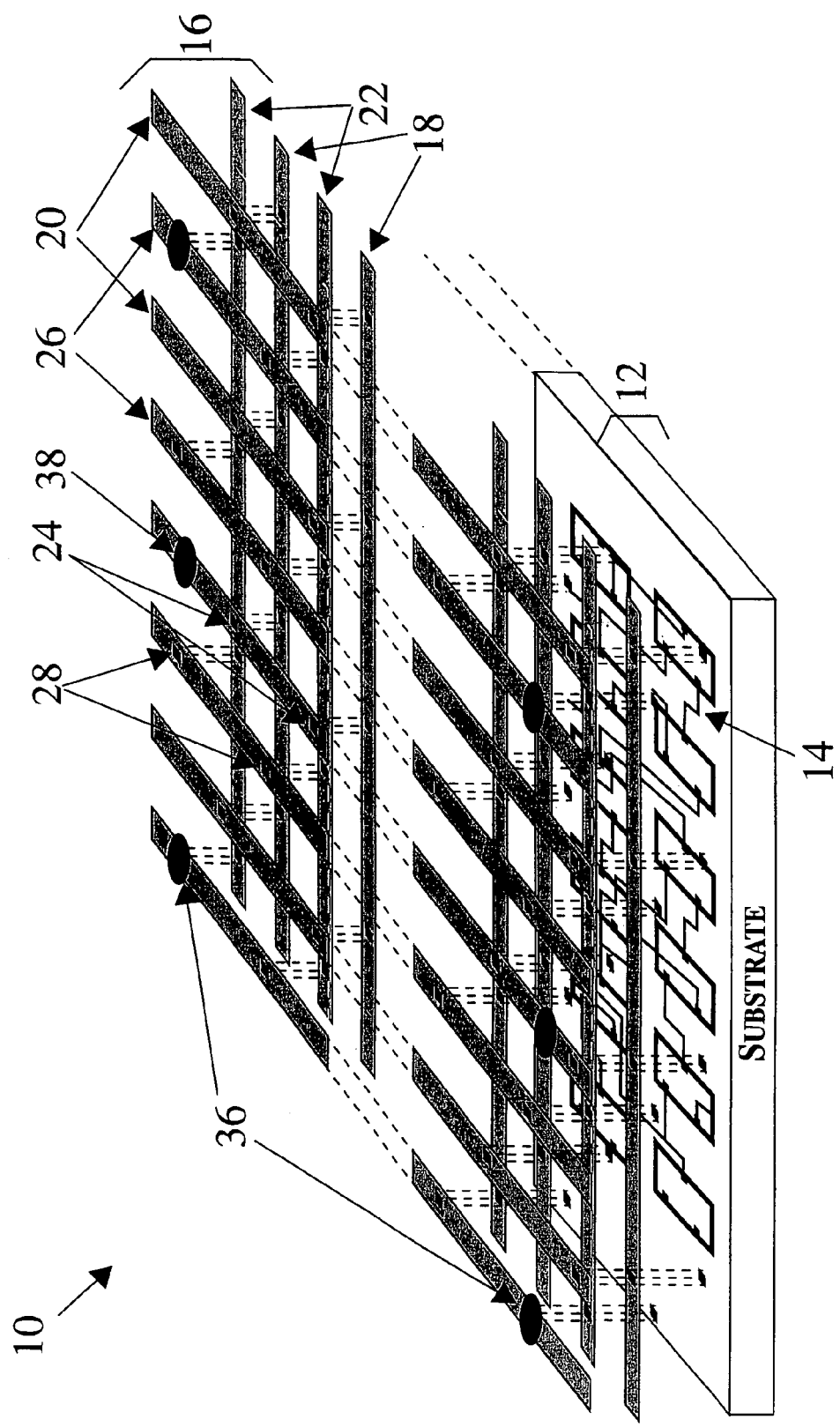
FIG. 1 is a three-dimensional, exploded view of the inner structure of a typical IC die.

Referring to FIG. 1, a typical IC die 10 includes a substrate 12, on which circuit devices such as transistors, resistors and capacitors are formed, signal routing conductors 14, and a three-dimensional power distribution conductor network, or power grid, 16. The power grid includes layers of metallic conductors (commonly referred to as M1, M2 etc., but designated herein by numbers) having signal routing conductors disposed there between as needed. Thus, for example, a first layer of interleaved parallel metallic conductors 18, 22 (or "M1") is provided, and a second layer of interleaved parallel metallic conductors 20, 26 (or "M2") is disposed above and perpendicular to the conductors 18, 22. Conductors 18 and 20 are ground ("gnd") conductors and are connected together through vias 24. Conductors 22 and 26, are power ("pwr") conductors and are connected together through vias 28. The ground conductors 18, 22 are known collectively as the "ground grid" and the power conductors 22, 26 conductors are known collectively as the "power grid." While only two metallic conductor layers 18, 22 and 20, 26 have been shown for illustration, this mesh configuration of power and ground conductors usually comprises many metal layers.

Some of the power conductors 26, and ground conductors 20 are terminated at the top of the die with power electrical connection pads 36 ("$P_{pwr}$") and ground electrical connection pads 38 ("$P_{gnd}$"), respectively, which form respective interleaved two-dimensional arrays. In this way, the power grid 16 provides room at the top of the die for input signal electrical connection pads and output signal electrical connection pads, while permitting the power distribution network within the die to be relatively dense. All of the pads are commonly known as "C4" pads. The region enclosed by 4 power pads 36 in FIG. 1 is referred to as a "quad".

When the die is packaged, the external IC ground ("GND") is applied to all of the ground pads $P_{gnd}$ 38 and the external IC power ("PWR"), e.g., supply voltage "$V_{DD}$", is connected to all of the power pads $P_{pwr}$ 36 so that the resistance between the power source and the devices within the IC that use the power is minimized. The current $I_{DD}$ drawn by the IC is the sum of the currents drawn at all of the power or ground pads. After the die is fabricated, but prior to packaging, the power and ground pads can be accessed to measure the respective individual currents, which enables a defect to be detected and located in accordance with the present invention.

Figure 2:
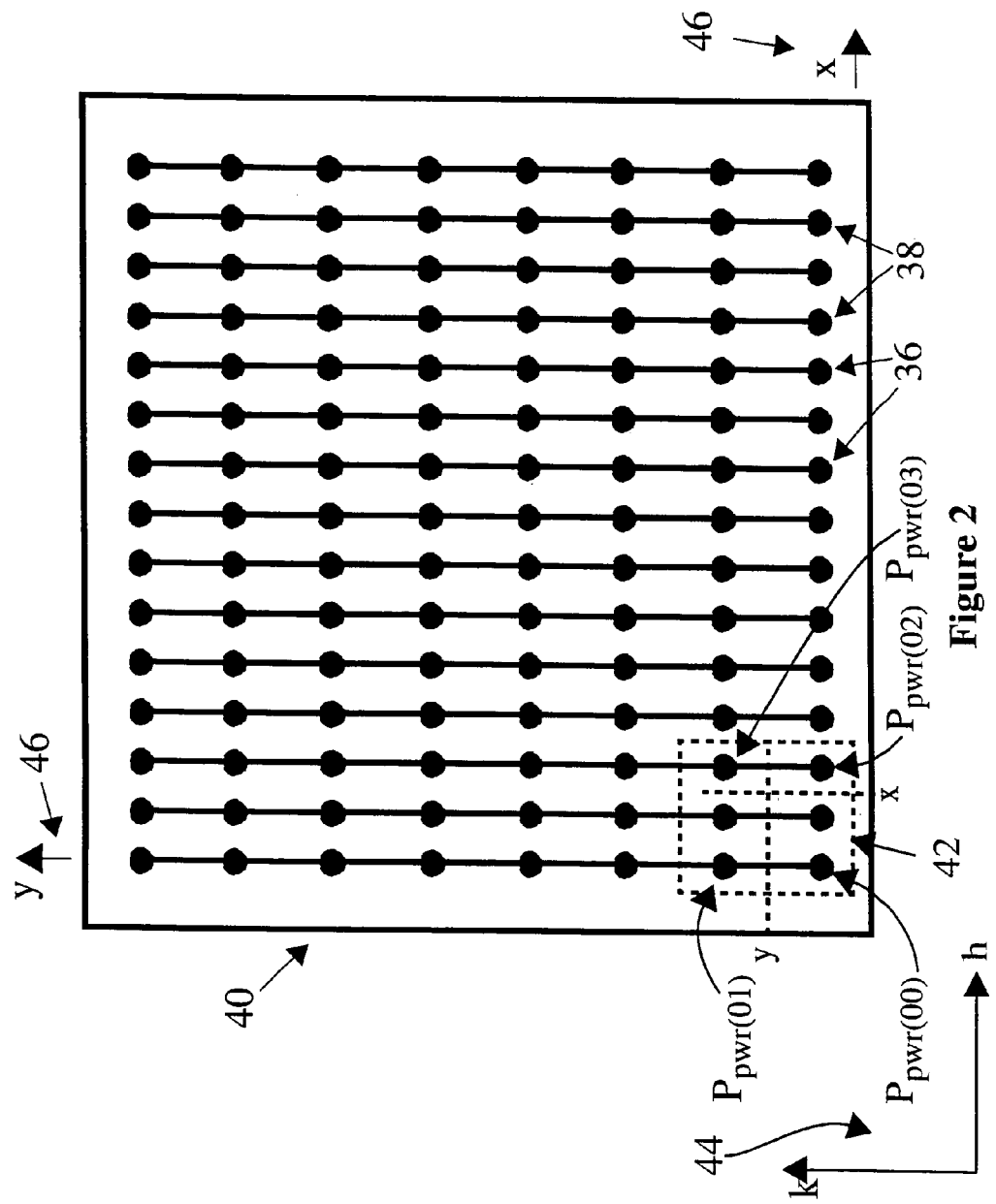
FIG. 2 is a top, illustrative view of a typical IC die showing electrical power connection pads and a portion thereof known as a quadrant.

Ordinarily, the power pads $P_{pwr}$ 36 are arranged in a two-dimensional square array 40, as shown in FIG. 2. The array 40 can be subdivided into adjoining 2×2 arrays of power pads, each of which is referred to as a "quad" 42, as mentioned above, and shares two power pads with the next adjacent quad in a given one of two orthogonal directions. Each quad may be assigned an index "q", which runs from 0 to ($M-2M^{1/2}+1$), and within each quad each power pad may be assigned an index "p", which runs from 0 to 3; thus, a given power pad is designated herein either generally as $P_{pwr}(m)$, where m ranges from 1 to M, or relative to a quad as $P_{pwr}(qp)$. "M" is the total number of power pads. The current drawn by a given power pad may then be designated either as $i_{pwr(m)}$ or $i_{pwr(qp)}$, which are distinguishable by the number of subscripts.

The number L of ground pads $P_{gnd}$ may be, but is not necessarily, the same as the number M of power pads. The ground pads could also be subdivided into quads for the purpose of implementing the present invention, as will be explained below.

The physical location of a power pad in a global Cartesian coordinate system 44 may be designated by a pair of coordinates [h,k]. The physical location of a feature of the IC within a quad may be designated by the coordinates [x,y] of a local Cartesian coordinate system 46 whose origin is one of the pads of the quad, as explained below. Thus, a defect within quad "q" would be located at position [x,y], as shown by FIG. 2.

2. IC Defects

Figure 3:
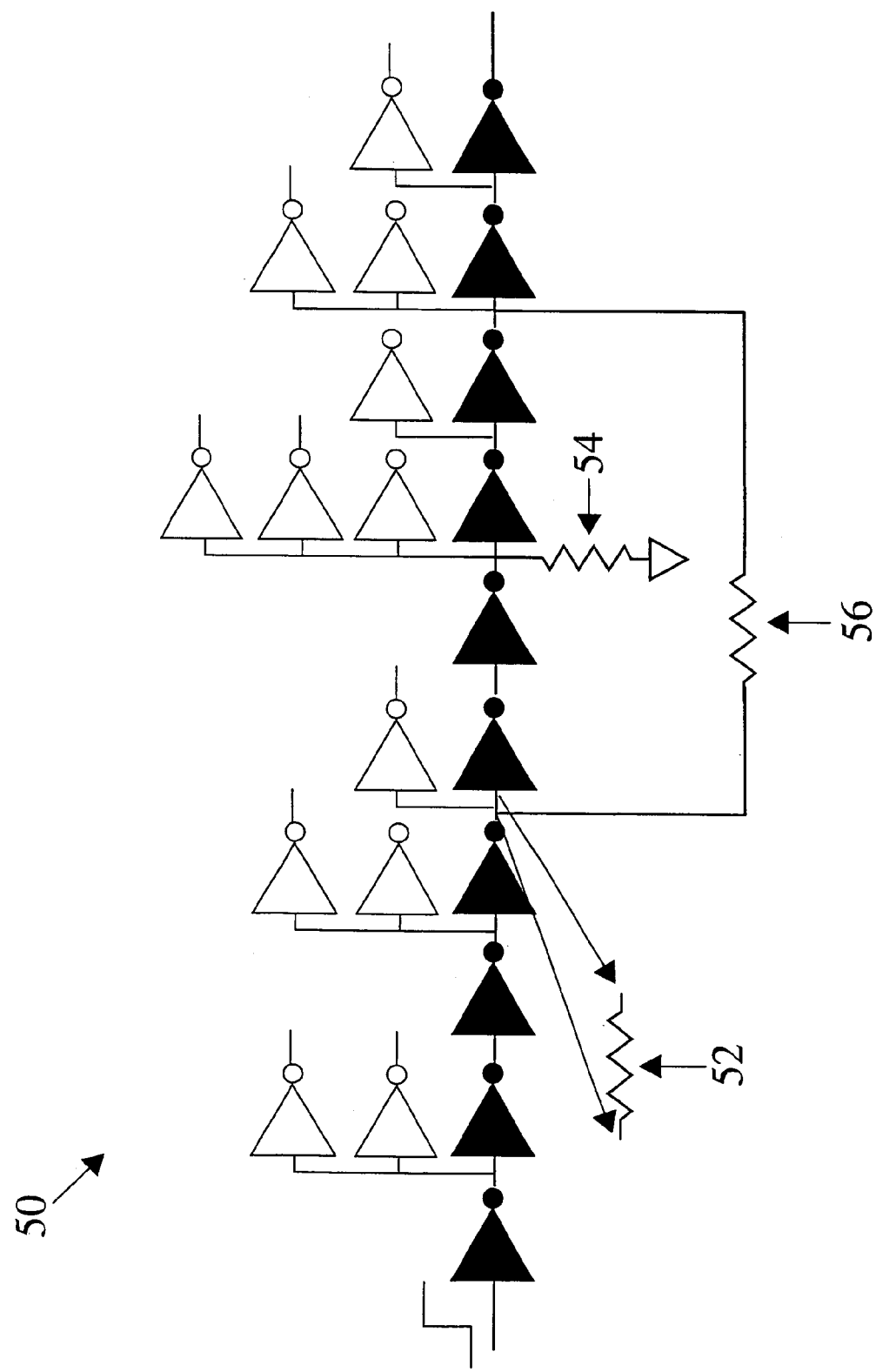
FIG. 3 is a logic diagram illustrating some types of defects that may be produced when an IC die is fabricated.

While the principles of the invention described and claimed herein may be applied to analog as well as digital ICs, the application of greatest interest is to digital ICs and the invention is explained in the context of digital ICs. FIG. 3 shows an exemplary set of logic devices 50 within an IC so as to illustrate some types of defects that may be produced in the fabrication of a digital IC die. Thus, there may be an open logic signal circuit between one device and the next, represented by resistance 52; a short to ground in a logic signal circuit, represented by resistance 54; or a bridge from one logic signal line to another, represented by resistance 56. All of these defects produce anomalies in the power supply currents. These anomalies are used in the present invention to detect and locate the defects.

While it will be appreciated that there are many pathways between a given power pad of a power grid as described above and the IC ground, the various impedances in the network of pathways between a point in the substrate of the IC and the power pads can be reduced to equivalent impedance, as is well understood in the art. Defect anomalies will alter the supply currents in these equivalent impedances from what they would be in a defect-free IC die.

Figure 4:
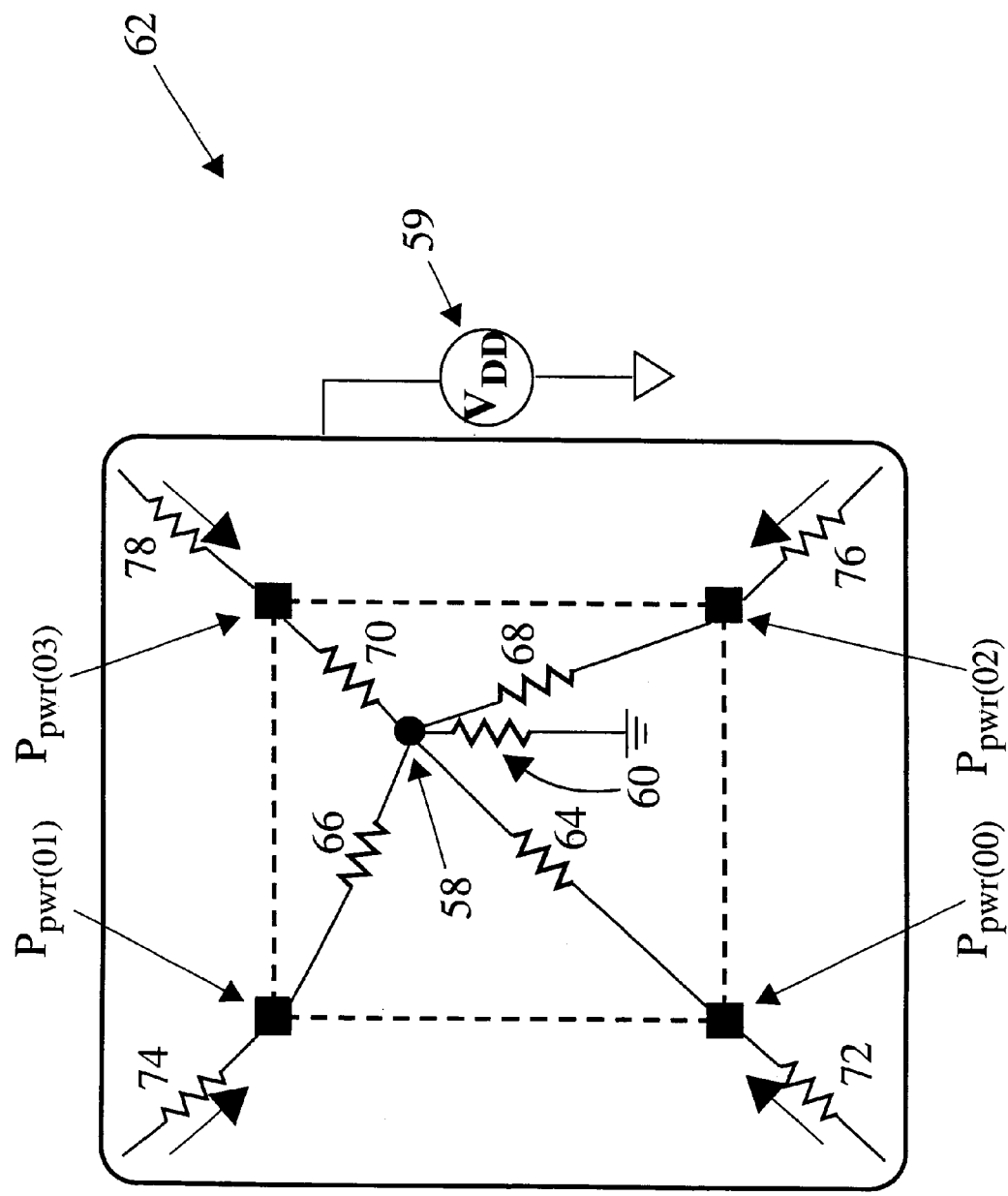
FIG. 4 is a simplified schematic diagram of a quadrant of an IC die illustrating the concept of equivalent resistance.

For example, as shown in FIG. 4, where a defect 58 produces a short, represented by resistance 60, from a logic signal line to ground, upon application of supply voltage 59

$V_{DD}$ an elevated steady-state or quiescent supply current is produced through equivalent resistances 64–70 to the four power pads $P_{pwr(00)}$–$P_{pwr(03)}$ of the quad 62 (q=0 in this case) in which the defect resides. The magnitude of the elevated currents measured at the supply pads is dependent on the location of the short 60 as well as the underlying architecture of the IC die as a whole. Likewise, the magnitude of the transient current would be dependent on the location of the short in the case of a dynamic signal and on distributed reactances.

To measure the currents, a test probe must be connected to the power pads $P_{pwr(00)}$–$P_{pwr(03)}$. This gives rise to contact impedances 72–78, which must be taken into account in making measurements.

3. The Test Principles

According to the principles of the present invention, the defect anomalies are identified from the currents measured at power, or ground, pads by a test probe. These currents are measured simultaneously as a means for detecting and locating regional signal variations introduced by defects. Preferably, the transient signals generated at each of the M power pads 36 ($P_{pwr(m)}$) are analyzed as a test sequence is applied to the inputs or scan latches of the IC logic circuitry. The basic strategy underlying the method is to make use of the spatial variations in the transient signals measured individually at each $P_{pwr(m)}$ as a means of detecting the defect. The transient signal variations introduced by the defect manifest in the current measured at surrounding $P_{pwr(m)}$s proportional to the "equivalent impedance" between the defect site and each of the $P_{pwr(m)}$s. However, it is to be recognized that such signal variations also manifest in the current variations measured at ground pads $P_{gnd(n)}$, which may also be used. According to the present invention, a defect is detected and located using a mapping from the measured supply currents to circuit layout coordinates, as described hereafter.

While some defects can be identified using quiescent, steady-state current analysis, other defects can only be identified in response to a change in the input signal.

In the case of a digital IC, the defects manifest themselves as anomalies in the transient current signals at the power pads $P_{pwr(m)}$ produced by a change from one logic state to another. As the analysis of transient waveforms themselves is computationally expensive, the area under the waveform over a predefined time interval is computed and used in the analysis instead. The area under the current transient waveform is designated as $ia_{(m)}$ or $ia_{(qp)}$ for a given power pad $P_{pwr(m)}$ or $P_{pwr(qp)}$.

Figure 5:
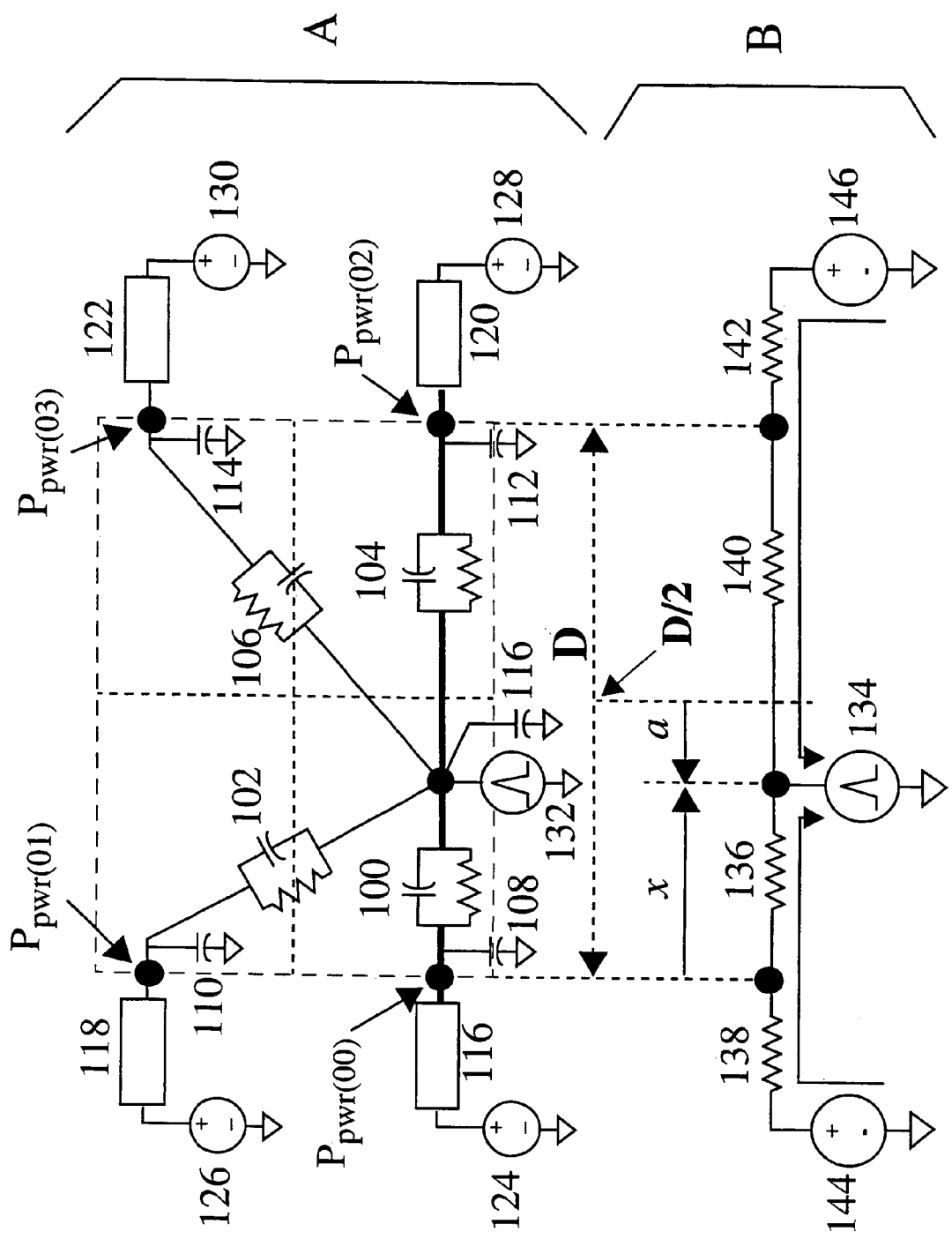
FIG. 5 is a simplified schematic diagram of a quadrant of an IC die illustrating, in Part A, the concept of equivalent impedance and, in Part B, a resistance-only equivalent circuit for two power connections of the quadrant.

In the case of transient signals, the reactances of the circuit must be taken into account. Accordingly, a more sophisticated equivalent impedance model is initially needed, as shown by FIG. 5, Part A. In this model the equivalent series impedances are represented by resistor-capacitor pairs 100–106, other distributed capacitances are represented by capacitors 108–114, contact impedances are represented by boxes 116–122, and the power supply is represented by voltage sources 124–130. The defect is represented by current source 132. However, because of the regularity of the power grid's resistances and capacitances, this can ordinarily be reduced to a resistance only model, as shown in FIG. 5, Part B. In this case current source 134 represents a defect at some location within a quad, resistor 136 represents the equivalent impedance from power pad $P_{pwr(q0)}$ to that defect, resistor 138 represents the contact impedance for that pad, resistor 140 represents the equivalent impedance to adjacent pad $P_{pwr(q2)}$, and resistor 142 represents the contact impedance at that pad. Voltage sources 144 and 146 represent the power sources applied to the respective power pads. "D" is the distance between the pads, "x" is the distance from $P_{pwr(q0)}$ to the defect, and "a" is the difference between D and x. This model is used to find the parameters of a hyperbola described below. For the y dimension, $P_{pwr(q1)}$ would be used instead Of $P_{pwr(q2)}$, with an analogous model.

The magnitude of measured $ia_{(m)}$s in response to any given test sequence vary widely depending on fabrication process variations and the impedance characteristics of the grid. Ideally, defect detection, and the defect position predicted by the mapping procedure, should be independent of the fabrication process variations and grid parameters. This is accomplished by computing current fractions δ using the $ia_{(qp)}$s measured at a pair of adjacent power pads. For example, the fraction of current $I_{DD}$ measured at pad $P_{pwr(00)}$ for a defect located between pads $P_{pwr(00)}$ and $P_{pwr(02)}$ of quad m=0 in FIG. 2 is given by $$\delta_{(00)} = ia_{(00)}/(ia_{(00)} + ia_{(02)})$$

Figure 6:
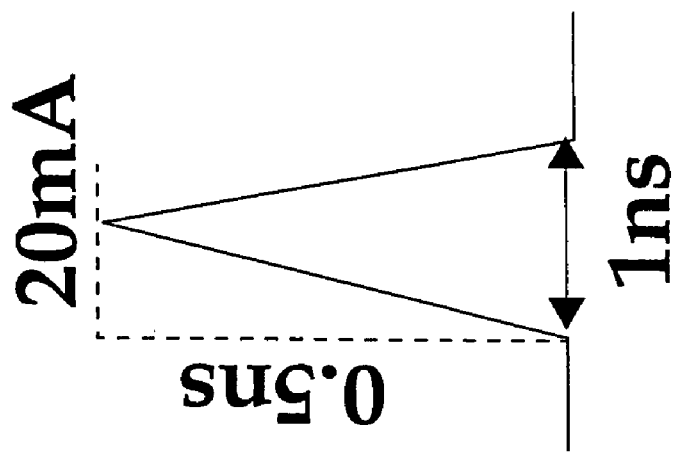
FIG. 6 is a waveform of a defect simulation transient signal.

It has been found in defect simulations that, for a given current fraction $\delta_{(qx)}$ or $\delta_{(qy)}$ between two horizontally or vertically adjacent power pads of a quad, respectively, the location of the defect in the quad that caused the anomaly lies on a curve that approximates a hyperbola. More specifically, it has been shown, by applying the triangle wave stimulus $i_s(t)$ shown in FIG. 6 between the power and ground metal conductors at a plurality of locations in a quad of a reference IC without any other defect, measuring the current fractions produced thereby between adjacent pads $P_{pwr(q0)}$ and $P_{pwr(q1)}$ along the y dimension, and plotting the positions of wave stimulus for common current fractions, the family of curves 150 in FIG. 7, Part A, is produced. Similarly, when the current fractions produced between adjacent pads $P_{pwr(q0)}$ and $P_{pwr(q2)}$ along the x dimension are measured, the family of curves 152 in FIG. 7, Part B, is produced. As can be seen in Parts A and B of FIG. 7, the curves found by this procedure approximate the segments of hyperbolas 154 and 156, respectively.

Figure 7:
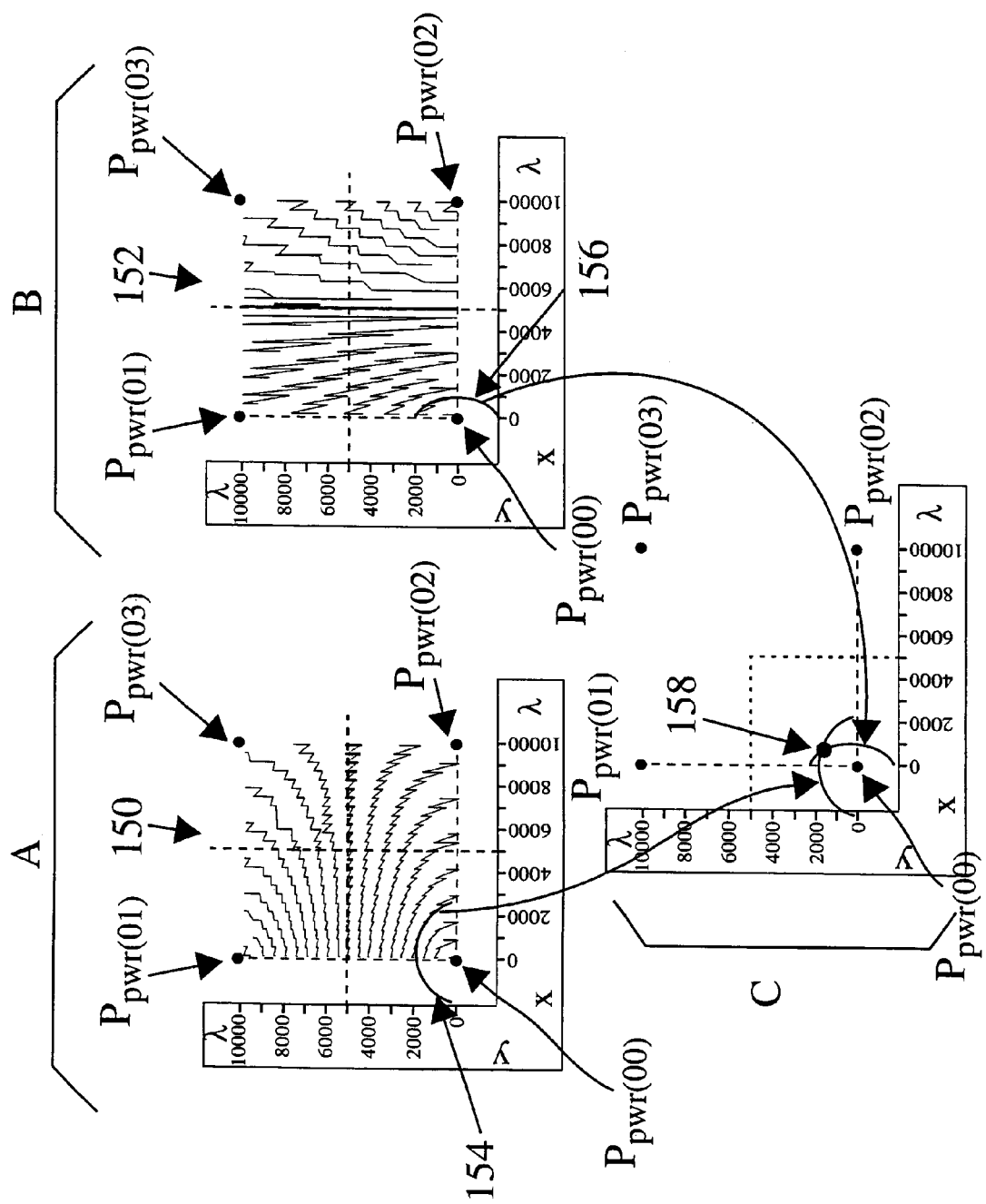
FIG. 7 is a set of related diagrams showing a hyperbola model for locating a defect in an IC in accordance with the present invention.

In a test for defects, rather than a simulation, the intersection of the two hyperbolas 154 and 156 defines an (x,y) coordinate that represents the center or "centroid" 158 of transient activity within the quad of the device under test ("DUT") under a test sequence, as shown in FIG. 7, Part C. The same procedure is applied to the other quads of the DUT. The set of (x,y) coordinates for the DUT can then be compared with those obtained from other defect-free chips. If the (x,y) position for any quad is significantly different (in the statistical sense), the DUT is deemed defective.

Since the use of current fractions eliminates performance differences between defect-free chips, the positions of the centroids among the defect-free chips are similar under the logic test sequence. The presence of a defect, on the other hand, will introduce regional signal variations and will move the centroid in one or more quads. The quads that are most significantly affected are those adjacent to the quad containing the defect because they are positioned to receive a mix of defect and defect-free signal information.

It is to be recognized that the frequency domain representations of the transient waveforms may be used to obtain the same or equivalent results without departing from the principles of the invention. In that case, discretized (sampled) versions of the transient current (or transient voltage) waveforms are acquired and a Fourier Transform ("FT") is performed on the data so acquired. The FT produces a pair of "magnitude" and "phase" components for each of the frequencies that are present in the time domain waveform. The magnitude and phase "spectra" can be viewed as curves, with magnitude or phase on the y-axis and frequency on the x-axis. The area under these curves can be computed as is done for the time domain transient waveforms. More importantly, the areas under portions of the magnitude and phase curves representing respective frequency bands can also be used. By choosing a particular range of frequencies (frequency band), it is possible to eliminate test environment noise. By eliminating noise, it is possible to increase the resolution of the methods to detecting and locating faults.

In addition, the entire methodology can be applied using the transient waveforms measured on the ground pads $P_{gnd}(n)$. For fault detection, this analysis can be used to increase the confidence that the test DUT is bad. For fault localization, the position obtained from the GND pad analysis may provide additional information about the actual circuit "node" that is defective. Using only the power of ground pad currents, the analysis predicts the position on the power or ground grid at which the defect is drawing current; however, this position may not be the exact position of the defect. If the defect exists on the output node of a gate and not in the gate itself, then it is possible that the defect may be located some distance from the predicted position. The prediction provided separately by the ground pad analysis may be combined with the prediction provided by the power pad analysis to narrow down the list of candidate logic signal wires that could be defective.

5. The Test Probe

Figure 8:
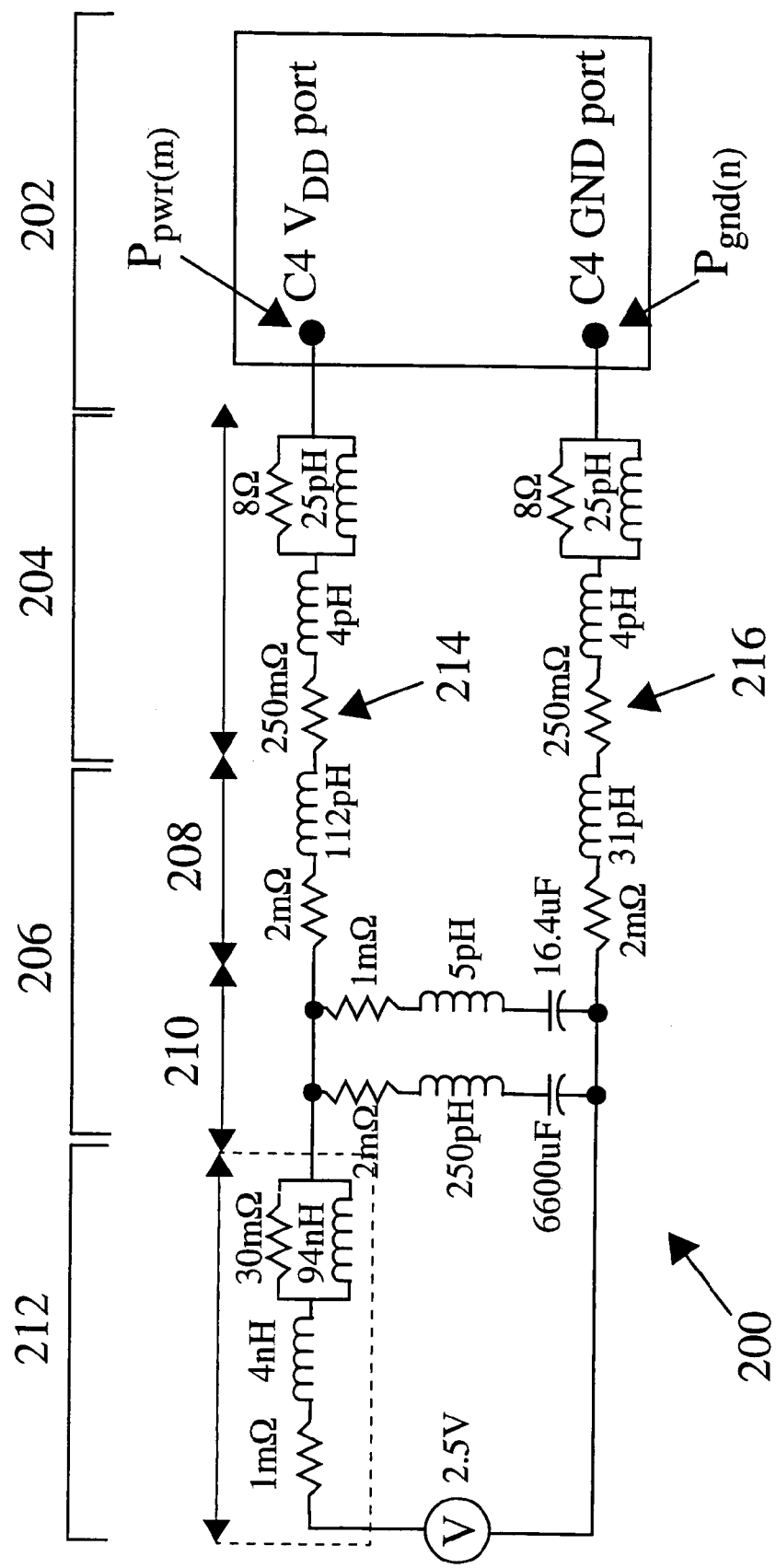
FIG. 8 is a schematic diagram of a test power supply, probe card and contact system for testing an IC.

A circuit model of a test probe 200 is shown in FIG. 8, including typical lumped circuit component values, together with a quad resistor-capacitor model 202 having a power pad $P_{pwr(m)}$ and a ground pad $P_{gnd(n)}$. The probe includes a contact membrane 204; a printed circuit board 206, having a probe card 208 and decoupling stages 210; and a test system power supply 212. The decoupling stages compensate for the limited frequency response of the system power supply. The probe card portion represents the distributed resistances and reactances associated with the printed circuit board conductors. The contact membrane portion represents the contact impedances. It is to be understood that this test probe model is exemplary only, and is not intended to be limiting, as other circuits may be used without departing from the principles of the invention.

6. Calibration Circuits

The use of current fractions as described above should adequately accommodate global fabrication process variations, but not variations in the testing environment. Consequently, calibration circuits ("$CC_{(qp)}$") and a linear algebra technique are used to calibrate the measured $ia_{(m)}$s and to provide a common framework for comparing chip data with a reference. More specifically, the procedure is able to calibrate the $ia_{(m)}$ data from a test DUT to a set of values that would have been measured under a different set of probe card parameters. The objectives of this calibration are: (1) to reduce signal variations that are not of interest, such as those introduced by fabrication process variations in the IC and testing environment noise, and (2) to calibrate the measured values so that universal pass/fail criteria can be applied to the entire set of chips.

The calibration circuits are placed under corresponding power pads, and may be turned on selectively. In this way, a short located in the IC circuit at the location of the power pad may be emulated. By turning on the calibration circuits one-by-one in the DUT, calibration current areas can be measured for calibrating the current measured under a logic test of the test DUT (those used in the current fractions identified previously). In addition, by turning on the calibration circuits one-by-one in a non-defective reference IC die, or by simulating the response of a non-defective IC die to turning on the calibration circuits one-by-one, a similar set of calibration currents areas are obtained that can be used to transform the test DUT current fractions to the probe card model used in this reference IC. This process provides the basis for accomplishing item (2) in the objectives identified above.

The 250 mΩ resistors adjacent to points 214 and 216 in FIG. 8 represent probe contact resistance, and have the potential to vary widely from touch down to touch down of the probe card. Given the low impedance nature of the power grid, even small changes in contact resistance can introduce large changes in the distribution characteristics of the current to the power and ground pads. The calibration procedure described herein is capable of virtually eliminating signal variations that occur because of probe card variations, and is also able to reduce signal variations introduced by changes in the power grid impedance characteristics across test DUTs.

Figure 9:
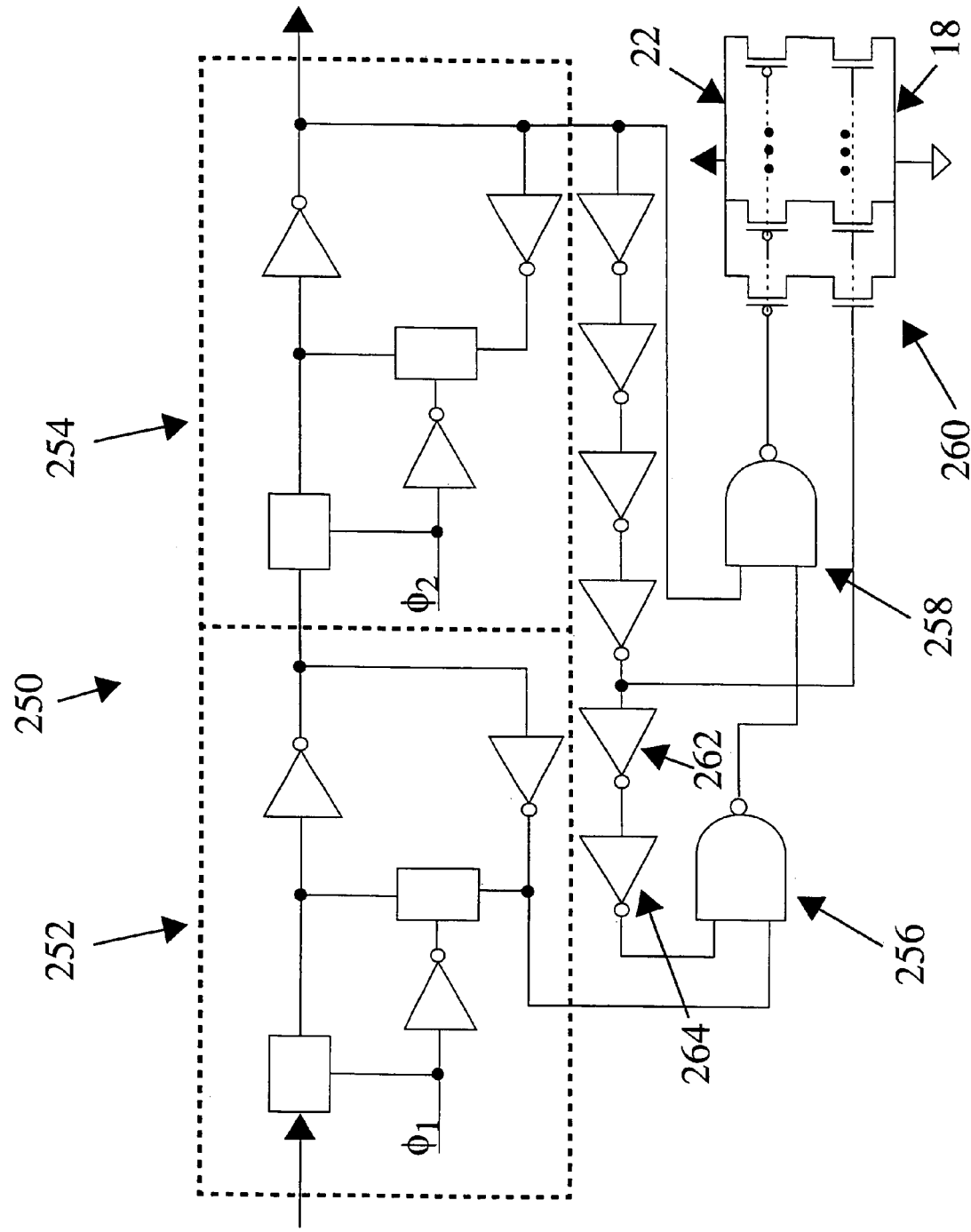
FIG. 9 is a schematic diagram of a preferred embodiment of a calibration circuit used in accordance with the present invention.

One way to account for contact resistance variations is to add circuitry that allows calibration tests to be performed. A circuit that can be used to perform the calibration tests can be relatively straight forward, such as shown in FIG. 9. The circuit 250 comprises 2 latches 252 and 254, two NAND gates 256 and 258, and a parallel set of N- and P-channel transistors configured in an CMOS inverter configuration 260. The sources of the N- and P-channel transistors are connected to the power ($V_{DD}$) conductor 22 and ground (GND) conductor 18 of the power grid 10. When the DUT is fabricated, one copy of this circuit is placed under each of the power pads $P_{pwr(m)}$ in the DUT.

Figure 10:
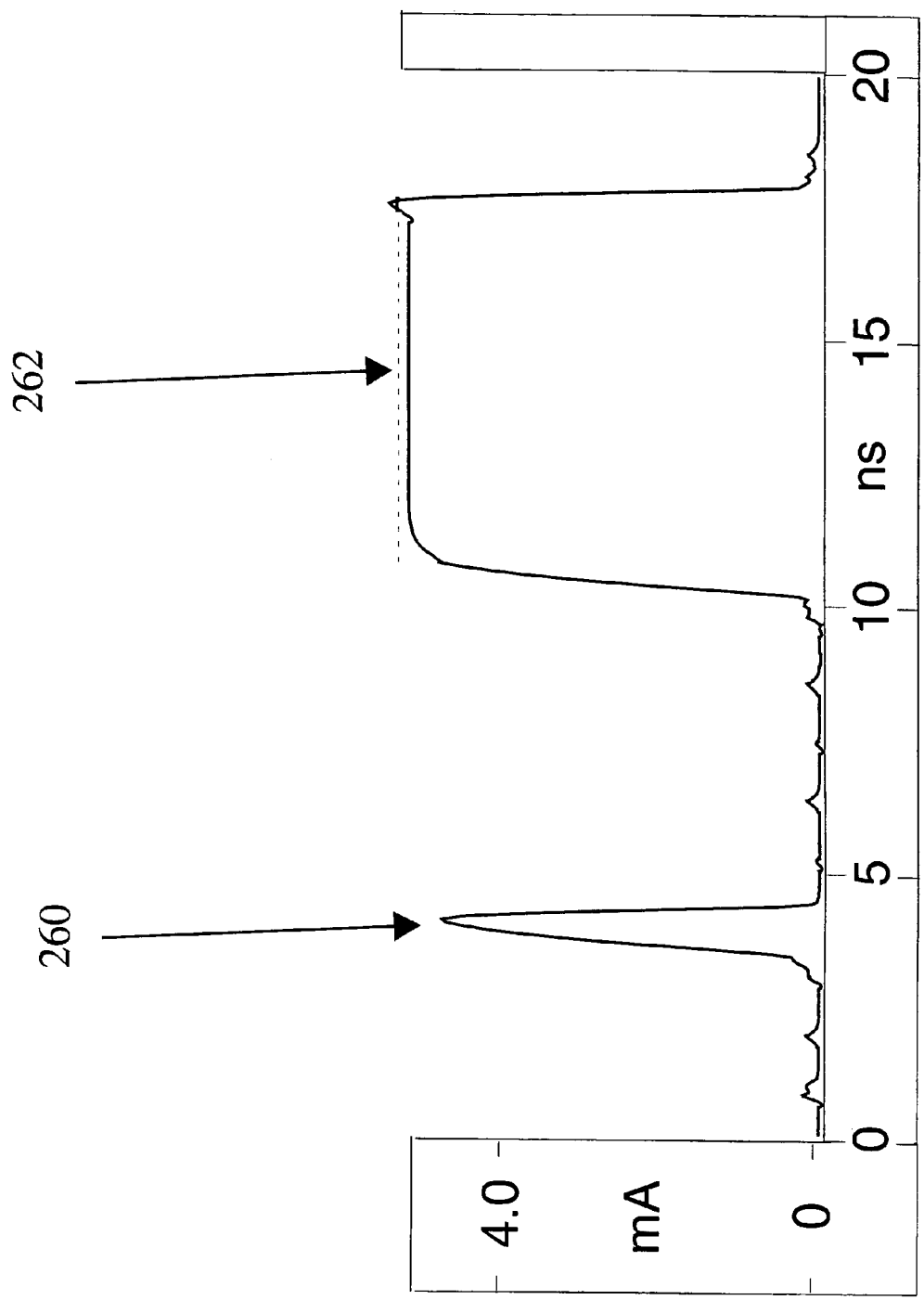
FIG. 10 is a graph of typical calibration circuit waveforms used in accordance with the present invention.

The latches 252 and 254 are connected in a scan-chain configuration which is separate from the scan chains that drive the core logic to enable the calibration and defect tests to be conducted independently. The NAND-NAND logic, 256 and 258, allows either a momentary "transient" short whose duration is given by the time it takes a logic signal to propagate from the input of gate 262, through gates 264 and 256, to the output of gate 258. For example, initializing the scan chain to all 0's and shifting a string of 1's will introduce a momentary short as the leading 1 is clocked into latch 254. Similarly, shifting a 1 through a 0 initialized scan chain will sustain a short for as long as a 0–1 state is kept in latchs 252 and 254, respectively. FIG. 10 shows plots of the power supply signals produced by circuit 250 under the transient test 260 and steady-state shorting test 262.

7. Elimination of Contact Resistance Variations

The change in the distribution of current caused by contact resistance variations of the probe card 200 can be calibrated away using the aforementioned linear transformation procedure. According to the procedure, a translation matrix X is computed using calibration current areas for two ICs, a reference IC having a representative current area matrix R, and a test IC (the DUT) having a measured current area matrix A. The X matrix is composed of a set of coefficients that represent the scalars needed to translate the current areas measured under a logic test of the test DUT to the current areas that would have been measured on the reference IC under the same logic test but a different set of probe card parameters. Thus, the test DUT $ia_{(m)}$ data is calibrated to the reference IC's probe card, and power grid to a smaller degree.

As indicated, this calibration procedure makes use of calibration current areas which are collected after the probe card is seated on the test DUT but before any logic tests are applied. For example, the calibration current areas for a portion of the power grid defined only by quad q=0 and p=0–3 in FIG. 2 comprises 16 calibration current areas ("cia"s), that is, four cias from each of four calibration tests at $P_{pwr(00)}$ through $P_{pwr(03)}$. In the following equation, the $cia_{(pm)}$s define a matrix of values A, the rows index "p" representing the data from respective calibration tests and the column index "m" representing respective $P_{pwr(m)}$s. The calibration current areas for the reference IC is given by R, having elements $r_{(pm)}$, and may be found by actually measuring a defect-free device or by simulation.

$$X = A^{-1} * R \qquad \text{Eq. 1}$$

$$\begin{bmatrix} x_{00} & x_{01} & x_{02} & x_{03} \\ x_{10} & x_{11} & x_{12} & x_{13} \\ x_{20} & x_{21} & x_{22} & x_{23} \\ x_{30} & x_{31} & x_{32} & x_{33} \end{bmatrix} = inv\left(\begin{bmatrix} cia_{00} & cia_{01} & cia_{02} & cia_{03} \\ cia_{10} & cia_{11} & cia_{12} & cia_{13} \\ cia_{20} & cia_{21} & cia_{22} & cia_{23} \\ cia_{30} & cia_{31} & cia_{32} & cia_{33} \end{bmatrix}\right) \times \begin{bmatrix} r_{00} & r_{01} & r_{02} & r_{03} \\ r_{10} & r_{11} & r_{12} & r_{13} \\ r_{20} & r_{21} & r_{22} & r_{23} \\ r_{30} & r_{31} & r_{32} & r_{33} \end{bmatrix}$$

The N- and P-channel transistors in the calibration test circuits of the DUT and reference IC are not identical because of inter- and intra-die fabrication process variations, causing variations in the calibration stimuli; therefore, the sum of the current areas computed across each row of the A and R matrices are likely to vary. To eliminate the dependency of the transformation matrix X on the calibration stimuli, the A and R matrix elements are "normalized" by dividing each element by the total current area of its respective row. Then, the transformation matrix X is obtained for the DUT by computing the matrix product of 'A inverse' times R. Once X is obtained, the following equation, Eq. 2, is used to calibrate the vector of test DUT $ia_{(m)}$s ("$tia_{(m)}$"s) obtained from a logic test $T_i$ by computing the vector-matrix product $TIA_{(i)}$ times X, where "i" is the index for the particular test event.

$$CTIA_i = TIA_i * X \qquad \text{(Eq. 2)}$$

$$[ctia_0 \ldots ctia_3] = [tia_0 \ldots tia_3] \times \begin{bmatrix} x_{00} & x_{01} & x_{02} & x_{03} \\ x_{10} & x_{11} & x_{12} & x_{13} \\ x_{20} & x_{21} & x_{22} & x_{23} \\ x_{30} & x_{31} & x_{32} & x_{33} \end{bmatrix}$$

In this equation the vector CTIA represents the matrix of calibrated test DUT current areas ("$ctia_{(m)}$"s) at each of the $P_{pwr(m)}$s, whose values are subsequently used in the current fractions, $\delta_{(m)}$, for the detection and localization procedures. It is to be recognized that Equation 2 is illustrative of only one quad, and that for an entire integrated circuit of M power pads, the X matrix would be an M×M matrix, and the $TIA_i$ and $CTIA_i$ vectors would be M-element vectors.

8. Overview of the Process

Figure 11:
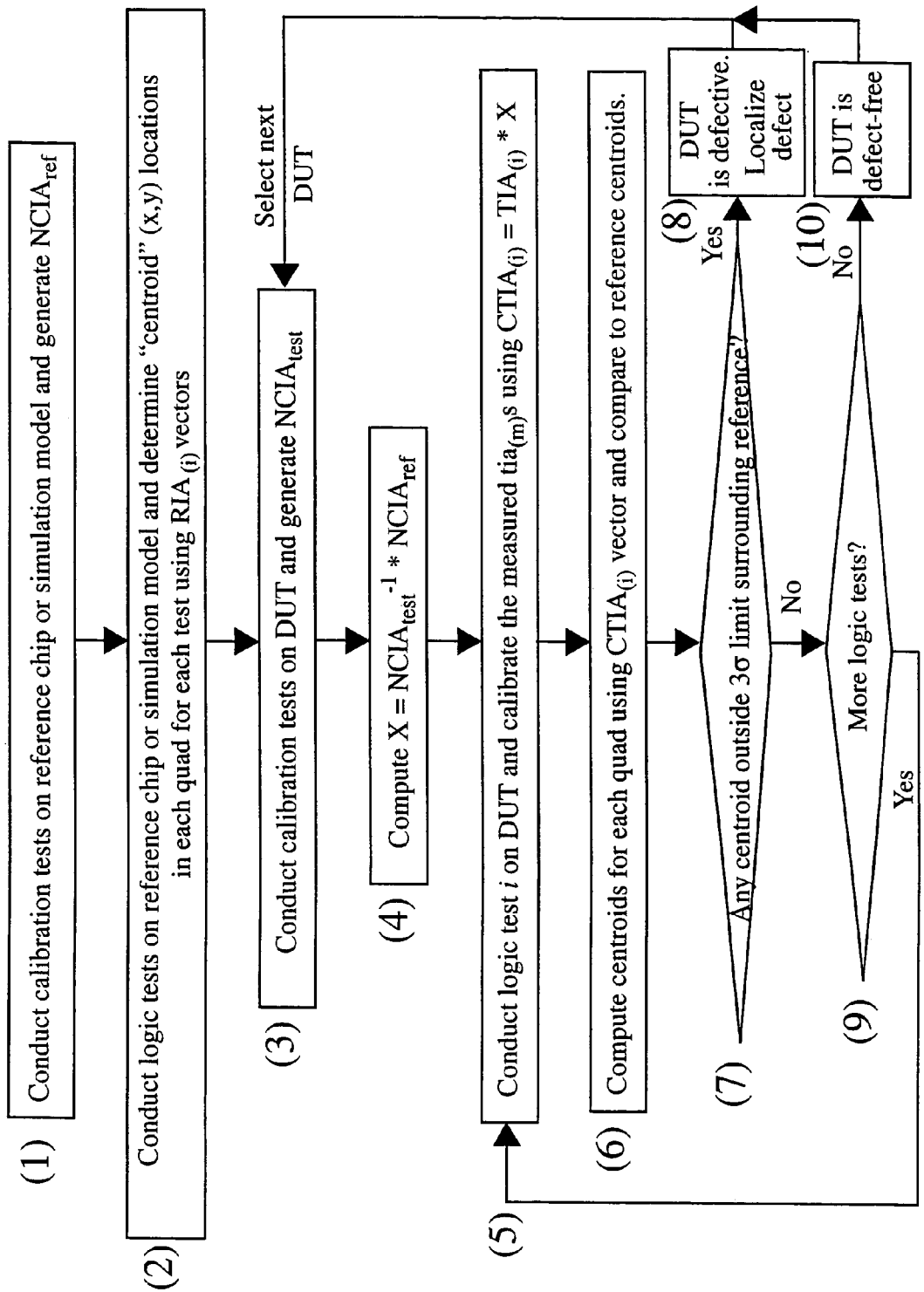
FIG. 11 is a flow chart of a preferred process according to the present invention.

As illustrated by FIG. 11, in a preferred embodiment of the method of the present invention, a known defect-free reference chip is selected or a simulation model of the circuit to be tested is constructed. In the former case, the probe card is first placed against reference chip so as to make electrical connections between the L ground pads $P_{gnd}$, the M power pads $P_{pwr}$ and N signal input and output pads $P_{in}$, on the one hand, and corresponding contacts on the probe card, on the other hand. Then, each of the M calibration circuits is turned on and off sequentially, for a predetermined integration time. While each calibration circuit is on, the individual power currents $i_{pwr(m)}(t)$ are measured, preferably the integrated areas measured first have leakage current subtracted from them. Leakage current is the current that is sourced through the pad when the inputs to the chip are not being changed. The total calibration current $i_{ctot}$ for the entire IC is also measured. These power currents are integrated over the integration time to produce respective "calibration current areas" $cia_{(m)}$ and a total current area tcia. The $cia_{(m)}$ are normalized by the tcia and saved as $ncia_{(m)}$ in an $M^{1/2} \times M^{1/2}$ matrix $NCIA_{ref}$, wherein the row index represents the calibration circuit and the column index represents the power pad at which the current is measured. The results of this process are identical if a simulation model is used instead. This step is designated (1) in FIG. 11.

An input test signal vector $V_{tsig}(t)$ is then applied to the input pads of the reference DUT, hereafter referred to as a logic test. It will be recognized that the test signal vector will ordinarily have N components $v_{tsig(n)}(t)$, corresponding to respective input pads $P_{in(n)}$ on the DUT. While the input test signal vector is applied, all of the M power currents $i_{pwr(m)}$ are measured, optionally adjusted for leakage current and integrated over the integration time to produce "reference current areas" $ria_{(m)}$. The $ria_{(m)}$ are saved as a 1×M area vector $RIA_{(i)}$, for each logic test i. It is to be appreciated that, in the case of a digital integrated circuit, the input test signal vector preferably comprises a temporal sequence of two digital vectors so as to produce a transient signal, though a sequence of more than two digital vectors might also be used.

For each quad, the appropriate current fractions are computed using elements of $RIA_{(i)}$ and the centroids (given by (x,y) coordinates) are computed and saved. (The details of this process are described in the next section). This process is repeated for each logic test. The data obtained from these tests is used in the testing process of all subsequent test DUTs. In the case of a simulation model, the process is identical except the logic tests are simulated under the simulation model. This step is designated by (2) in FIG. 11.

The same procedure is applied for each test DUT, i.e., the probe card is placed against the test DUT and the calibrations tests are performed. The $cia_{(m)}$ measured under each calibration test are normalized and saved as $ncia_{(m)}$ in an $M^{1/2} \times M^{1/2}$ matrix $NCLA_{test}$. (Step (3) in FIG. 11). After the completion of the calibration tests, a translation matrix X is computed by multiplying the inverse of $NCIA_{test}$ times $NCIA_{ref}$. (Step (4) in FIG. 11). The translation matrix X is used to calibrate the measured power currents $i_{pwr(m)}$ obtained from the application of the logic tests to the test DUT as explained below.

A logic test i is then applied to the DUT and the M power currents $i_{pwr(m)}$ are measured, optionally adjusted for leakage current and integrated over the integration time to produce "test current areas" $tia_{(m)}$. The $tia_{(m)}$ are saved as a 1×M area vector $TIA_{(i)}$. The $TIA_{(i)}$ vector is then transformed to a set of calibrated test current areas, $CTIA_{(i)}$ by computing the vector-matrix product of $CTIA_{(i)} = TIA_{(i)} * X$ (Step (5) in FIG. 11). The appropriate current fractions are computed using the $CTIA_{(i)}$ values and the centroids (given by (x,y) coordinates) are computed and compared against the centroids computed earlier using the $RIA_{(i)}$ values (Step (6) in FIG. 11). If any (x,y) position computed using the CTIA$_{(i)}$ values is located outside a predetermined region surrounding the reference centroid in any quad, then the test DUT is classified as defective (Step (7) to Step (8) in FIG. 11). The predetermined region can be based on a statistical characterization of noise sources that cannot be accounted for, such as those present in the testing environment. If the centroids of the test DUT fall within the reference centroid regions in all quads, then the test DUT passes the test (Step (7) to Step (9) in FIG. 11). The same process is repeated under each test vector (Step (9) to Step (5) in FIG. 11). The test DUT is classified as defect-free if it passes all tests (Step (9) to Step (10) in FIG. 11), otherwise it is classified as defective and a defect localization procedure is carried out using the CIA, RIA and TIA data from the test and reference DUTs as explained below (Step (8) in FIG. 11).

It is also possible to measure transient "voltage" waveforms instead of current waveforms and compute the area under the voltage waveforms. The individual voltages need to be measured close to the DUT, that is, near the C4 power pads, for example at points 214 and 216 in FIG. 8. At these points, the transient voltage is proportional, or is a reflection of, the transient currents because of the RLC components in the testing system, that is, the resistance in the probe card itself and in other connections and routing back to the test's power supply 212. An advantage is that transient voltages can be measured "non-invasively;" it is unnecessary to insert anything in series between the DUT and the test power supply, which is necessary where transient currents are measured.

9. Details of the Process

The calibration of the test DUT current areas is done to minimize the effect of variations in contact resistances between the probe card and DUT, and other series impedance elements between the DUT and test system power supply. Specifically, the inverse of the NCIA is taken to produce NCIA$^{-1}$ and that is multiplied times a reference matrix R to produce a transformation matrix X. In its simplest form, the reference matrix may be the identity matrix I; however, in the preferred embodiment the reference matrix comprises a matrix of the integrated areas of respective power currents into each of the M power pads for each of the M calibration circuits for either (1) a simulated device, or (2) an actual, defect-free reference device. The effect of variations in series RLC elements of the testing environment is to cause the currents to each of the supply ports to redistribute. The redistribution can be described by a linear transformation from one set of measured current areas (under one probe card model) to those measured under a second probe card model. The transformation matrix X provides the coefficients needed to realize the transformation.

Given the calibrated current areas from a logic test applied to the test DUT, whether the test DUT is defective or not can be determined. This is done by computing the centroids for each of the quads of the power grid, and comparing them with the centroids computed from a simulated or reference device. If any of the centroid positions of the test DUT differ from their expected positions by more than an acceptable amount, typically three standard deviations ("3σ"), the DUT is deemed defective.

To find the centroid of test current for a quad under a logic test applied to the test DUT, the ctia$_{(qp)}$ for each power pad P$_{pwr(qp)}$ of the quad are examined to identify the largest current area, whose pad is chosen as the principal pad. For example, assume without loss of generality that the ctia measured at P$_{pwr(q0)}$ is largest, having ncia$_{(q0)}$ and ctia$_{(q0)}$. The reference chip ncia values are used in this process, i.e., those from NCIA$_{ref}$. The two next highest current areas, chosen under the constraint that the corresponding power pads are orthogonally adjacent to the primary pad, define the secondary pads, which are in this example P$_{pwr(q1)}$, having ncia$_{(q1)}$ and ctia$_{(q1)}$, and P$_{pwr(q2)}$, having ncia$_{(q2)}$ and ctia$_{(q2)}$. Four calibration current fractions $\delta_{c(qx0)}$, $\delta_{c(qx2)}$, $\delta_{c(qy0)}$ and $\delta_{c(qy2)}$, and two test current fractions $\delta_{t(qx)}$ and $\delta_{t(qy)}$, are then computed, where:

$\delta_{c(qx0)}$ is the calibration current fraction in the x dimension, that is, between primary pad P$_{(q0)}$ and secondary pad P$_{(q2)}$, for quad q when the calibration circuit CC$_{(q0)}$ is applied;

$\delta_{c(qx2)}$ is the calibration current fraction in the x direction for quad q when the calibration circuit CC$_{(q2)}$ is applied;

$\delta_{c(qy0)}$ is the calibration current fraction in the y dimension, that is, between primary pad P$_{(q0)}$ and secondary pad P$_{(q1)}$, for quad q when the calibration circuit CC$_{(q0)}$ is applied; and $\delta_{c(qy)}$ is the calibration current fraction in the y dimension when the calibration circuit CC$_{(q1)}$ is applied;

$\delta_{t(qx)}$ is the test current fraction in the x dimension for quad q; and $\delta_{t(qy)}$ is the test current fraction in the y dimension for quad q.

For the calibration current fractions:

$\delta_{c(qx0)} = ncia_{(q0)}/(ncia_{(q0)} + ncia_{(q2)})$, where CC$_{(q0)}$ is applied;

$\delta_{c(qx2)} = ncia_{(q0)}/(ncia_{(q0)} + ncia_{(q2)})$, where CC$_{(q2)}$ is applied;

$\delta_{c(qy0)} = ncia_{(q0)}/(ncia_{(q0)} + ncia_{(q1)})$, where CC$_{(q0)}$ is applied; and $\delta_{c(qy1)} = ncia_{(q0)}/(ncia_{(q0)} + ncia_{(q1)})$, where CC$_{(q1)}$ is applied.

For the test current fractions:

$\delta_{t(qx)} = ctia_{(q0)}/(ctia_{(q0)} + ctia_{(q2)})$, and $\delta_{t(qy)} = ctia(q0)/(ctia_{(q0)} + ctia_{(q1)})$.

The current fractions are used, together with the coordinates of the principal pad, and a parameter "c", to find the equations of two hyperbolas, and the intersection of those two hyperbolas is taken as the centroid of the test current. The equation of the hyperbola is:

$$\frac{(x-h)^2}{a^2} - \frac{(y-k)^2}{b^2} = 1$$

where x is the x coordinate of a point on the hyperbola within the quad;

y is the y coordinate of a point on the hyperbola within the quad;

h is the x coordinate of the principal pad of the quad;

k is the y coordinate of the principal pad of the quad;

a is the minimum distance of the hyperbola to a line half way between the foci of the hyperbola;

c is half the distance between the primary and secondary pads and $b = [c^2 - a^2]^{1/2}$.

The "a" parameters are found from:

$a_{(qx)} = D/2 - D[(\delta_{c(qx0)} - \delta_{t(qx)})/(\delta_{c(qx0)} - \delta_{c(qx2)})]$, and $a_{(qy)} = D/2 - D[(\delta_{c(qy0)} - \delta_{t(qy)})/(\delta_{c(qy0)} - \delta_{c(qy1)})]$, and the corresponding "b" parameters are then found, as indicated above. Since the parameter "c" is provided, that is, c=D/2 (see FIG. 5), the two hyperbola equations are then defined, and the centroid is located by simultaneous solution of the two hyperbola equations for their intersection (x,y).

The centroid for each quad of the DUT is found as described above, and the positions of these centroids are then compared with the expected positions of the centroids, as stated above. Where the difference in position exceeds the acceptable amount, the DUT is taken as defective. The process could stop at this point, by simply rejecting the DUT. However, as discussed above, valuable information about the true position of the defect can be obtained by further analysis.

10. Localization

The centroids computed for the purpose of fault detection are not likely to yield accurate predictions of the actual location of the defect. This is because the $ia_{(m)}$s may include contributions from logic signals propagating along multiple paths in the DUT, only some of which are actually affected by the defect. The current area produced by the defect-free paths must be subtracted from the current area actually measured in order to obtain a meaningful prediction result.

Figure 12:
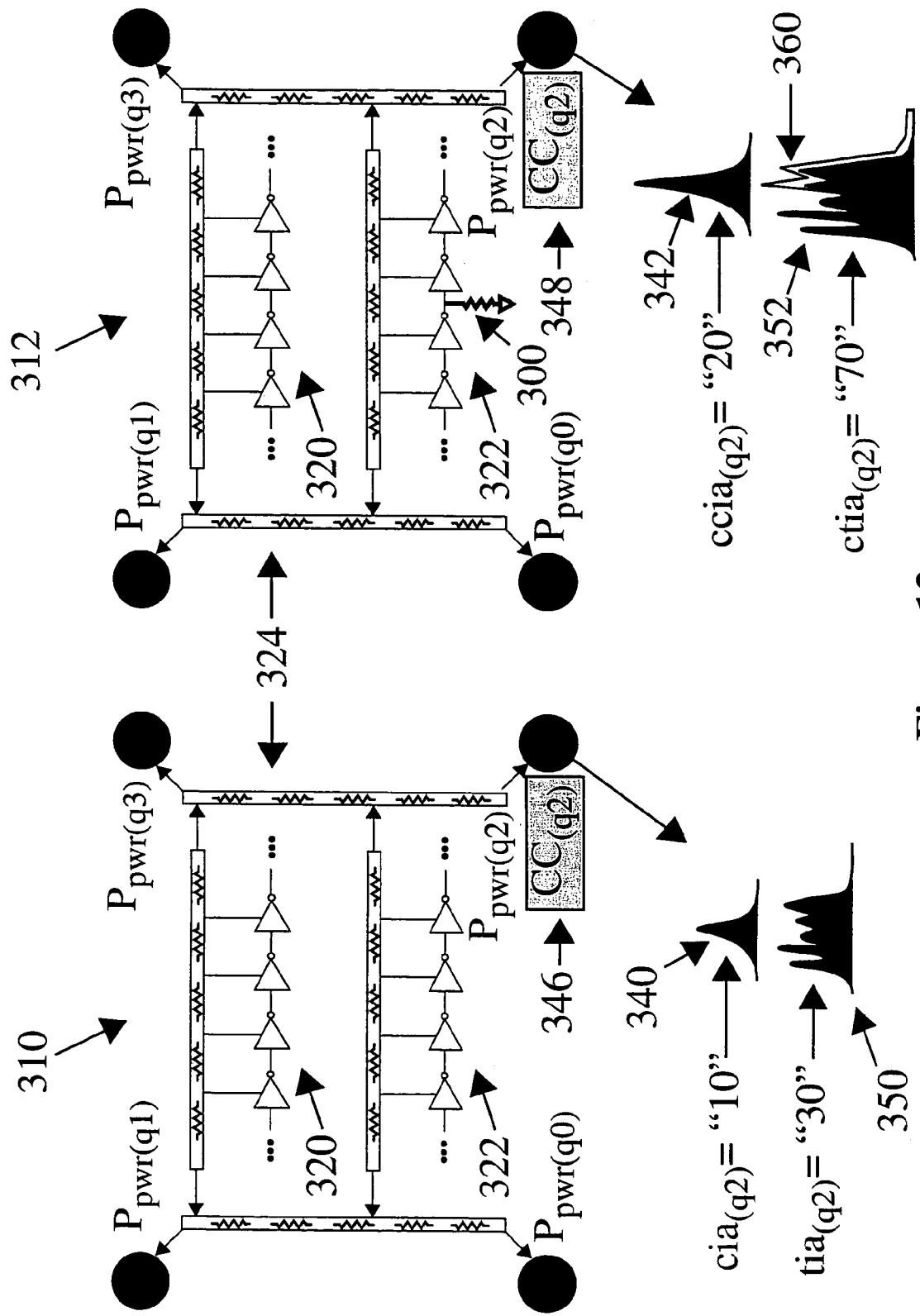
FIG. 12 is an illustration of the process of FIG. 11 performed for localization.

For example, FIG. 12 shows two quads, one from a reference chip 310 and one from a DUT 312. Two logic paths are shown in each quad 320 and 322 with the power grid resistance abstracted as strings of resistors 324. A resistive shorting defect 300 is shown in the DUT 312. Two current transient waveforms 340 and 342 are measured at the $P_{pwr(q2)}$s, in quad q of reference chip 310 and DUT 312, respectively, on applying calibration test circuit tests using $CC_{(q2)}$s 346 and 348. Two transient waveforms 350 and 352 are also shown for each of the $P_{pwr(q2)}$s under a logic test which propagates signals along paths 320 and 322. Arrow 360 identifies the portion of the waveform whose area is needed in the localization procedure. The remaining (defect-free) portion is produced by path 320 and by the portion of the path 322 preceding the actual defect site in DUT 312.

How the portion identified by 360 can be explained is given by the following example. To further illustrate the general application of the process, assume that in this case $P_{pwr(q2)}$, rather than $P_{pwr(q0)}$, is selected as the primary pad. The value of the "un-normalized" reference $cia_{(q2)}$ 340 is given as "10". (None of the calibration ias is divided by the total current to produce the $r_{(qp)}$s and $ctia_{(qp)}$s defined previously, since the "performance" information in the calibration ias needs to be preserved in this procedure). The value of the logic test area 350 is given as "30". Therefore, the ratio of $tia_{(q2)}/cia_{(q2)}=30/10=3$ for the reference chip. In order to obtain the "expected" area in the DUT, the calibration test area $cia_{(q2)}$ for waveform 342 is treated as test data and is first calibrated using the calibration procedure described earlier. In this case, the value of the "calibrated" test area ($ccia_{(q2)}$) is computed as "20", as shown in FIG. 12. The measured logic test area for the DUT waveform 352 is also calibrated and is shown in this example to be "70". The expected area is given as "60", which is the reference chip ratio, 3, multiplied by the $ccia_{(q2)}$, "20". The defect area, "10", is obtained as the difference between the $ctia_{(q2)}$ that was measured, "70" and the computed expected $ctia_{(q2)}$, "60". The same process is applied to $P_{pwr(q0)}$ and $P_{pwr(q3)}$ to obtain the remaining two logic test ias, $ctia_{(q0)}$ and $ctia_{(q3)}$. The difference value "10" obtained for the primary pad as well as the two difference values computed for the secondary pads is used to compute the test current fractions in the "centroid" based localization algorithm described in the previous section. Application of this algorithm yields an (x,y) coordinate that represents the predicted locations of the defect.

11. Test System

Although the focus of the foregoing description has been mainly on the calibration and testing process, it is to be recognized that the invention may be embodied in a physical system adapted to carry out the process. Thence, the test probe 200 shown in FIG. 9, together with a programmed digital computer, or special purpose processor, that acquires calibration and test data and carries out the mathematical computations of the process comprise an apparatus embodiment of the invention.

In addition, it is to be recognized that an IC that incorporates the calibration circuits described above comprises another facet and physical embodiment of the invention.

The terms and expressions which have been employed in the foregoing specification are used therein as terms of description and not of limitation, and there is no intention, in the use of such terms and expressions, to exclude equivalents of the features shown and described or portions thereof, it being recognized that the scope of the invention is defined and limited only by the claims which follow.

The invention claimed is:

1. A method for testing an integrated circuit having a power grid and a plurality of ordered connections to the power grid, comprising:
   applying a time-varying input signal to the integrated circuit;
   measuring a plurality of power signals produced at a plurality of respective ordered connections in response to the input signal;
   identifying a defect in the integrated circuit from a combination of two or more of the power signals so measured.

2. The method of claim 1, wherein at least that portion of the integrated circuit to be tested comprises a digital circuit.

3. The method of claim 2, wherein the time-varying input signal comprises a time varying vector of logic inputs.

4. The method of claim 1, wherein the measuring occurs at a first pair of the ordered connections and at a second pair of the ordered connections, the two power signals measured at each pair defining a contour of a power signal characteristic, the measuring further comprising determining the centroid of the power signal characteristic by finding the intersection of the respective contours for each pair of ordered connections.

5. The method of claim 4, wherein the first pair of ordered connections and the second pair of ordered connections share a common connection.

6. The method of claim 4, wherein the identifying defects comprises identifying the spatial location of at least one power signal characteristic centroid produced in response to the time-varying input signal that varies from its expected location.

7. The method of claim 6, wherein the evaluating comprises comparing the location of at least one or more said power signal characteristic centroids to a standard to determine whether those locations represent defects.

8. The method of claim 7, wherein the standard is an acceptable deviation from the expected location of the centroid in a reference device.

9. The method of claim 8, wherein the reference device is an actual reference circuit.

10. The method of claim 8, wherein the reference device is a simulated reference circuit.

11. The method of claim 7, wherein the measuring signals comprises measuring currents and the power signal characteristic is a current characteristic.

12. The method of claim 11, wherein the measuring signals includes integrating the measured currents over a measurement period to produce measured power signals.

13. The method of claim 7, wherein the measuring signals comprises measuring voltages and the power signal characteristic is a voltage characteristic.

14. The method of claim 13, wherein the measuring signals includes integrating the measured voltages over a measurement period to produce measured power signals.

15. The method of claim 7, wherein the measuring signals includes performing a time-frequency Fourier transform on the signals to produce frequency-domain representations thereof and the power signal characteristic is a frequency-domain characteristic.

16. The method of claim 15, wherein the measuring signals includes integrating the frequency-domain representations over a measurement band to produce measured signals.

17. The method of claim 1, wherein the measuring signals comprises measuring currents.

18. The method of claim 17, wherein the measuring signals includes integrating the measured currents over a measurement period to produce respective integrated current areas.

19. The method of claim 18, wherein the measuring occurs at a first pair of the ordered connections and at a second pair of the ordered connections, the two integrated current areas measured at each pair defining respective contours of current areas, the measuring further comprising determining the centroid of current area by finding the intersection of the contours for each pair of ordered connections.

20. The method of claim 19, wherein the set of locations for the first pair of ordered connections is at least a portion of the locus of points of a first hyperbola, the set of locations for the second pair of ordered connections is at least a portion of the locus of points of a second hyperbola.

21. The method of claim 20, wherein at least that portion of the integrated circuit to be tested comprises a digital circuit.

22. The method of claim 21, wherein the time-varying input signal comprises a time varying vector of logic inputs.

23. The method of claim 20, wherein the first pair of ordered connections and the second pair of ordered connections share a common connection.

24. The method of claim 20, wherein the identifying defects comprises identifying the spatial location of at least one integrated current area centroid produced in response to the time-varying input signal that varies from its expected location.

25. The method of claim 24, wherein the evaluating comprises comparing the location of one or more said integrated current area centroids to a standard to determine whether those locations represent defects.

26. The method of claim 25, wherein the standard is an acceptable deviation from the expected location of the centroid in a reference device.

27. The method of claim 26, wherein the reference device is an actual reference circuit.

28. The method of claim 26, wherein the reference device is a simulated reference circuit.

29. The method of claim 23, further comprising determining a test current fraction of current area measured at the common connection for each pair of connections relative to the total current area measured for both connections thereof in response to the time varying input signal and determining the respective hyperbolic contours therefore.

30. The method of claim 29, further comprising, without applying the time varying input signal:
   injecting a calibration signal in the integrated circuit at the location of said common connection;
   measuring currents drawn at each of the connections of the first and second pairs of connections in response to the preceding step;
   injecting a calibration signal in the integrated circuit at the location of the non-common connection of the first pair of connections;
   measuring the currents drawn at the connections of the first pair of common connections in response to the preceding step;
   injecting a calibration signal in the integrated circuit at the location of the non-common connection of the second pair of connections;
   measuring the currents drawn by the second pair of connections in response to the preceding step;
   for each of the two pairs of connections, determining the calibration current fraction responsive to a calibration signal that is drawn at each connection of each pair of connections when the calibration signal is injected at the location of each connection of the pair; and
   determining the hyperbola parameters for each pair of connections in response to the time varying input using the test current fractions and corresponding calibration current fractions to find the hyperbolic contours.

31. The method of claim 30 wherein, prior to computing test current fractions and calibration current fractions for the integrated circuit under test, all current areas are also measured for a reference device, the ratios of test current areas to calibration current areas are computed, those ratios are multiplied times the calibration current areas measured for the circuit under test, the products are subtracted from the respective test current areas for the circuit under test, and the respective differences are used to compute the current fractions which are employed to find the hyperbolic contours, and the intersection of the hyperbolic contours is taken to be the location of a defect.

32. The method of claim 30, further comprising, prior to computing the test and current fractions:
   determining a first two-dimensional array of reference calibration current areas for a reference device, one dimension of the array corresponding to the ordered connection at which a calibration current is measured and the other dimension of the array corresponding to the ordered connection at whose location a calibration signal is injected;
   determining a second two-dimensional array of test device calibration current areas for the integrated circuit under test, one dimension of the array corresponding to the ordered connection at which a calibration current is measured and the other dimension of the array corresponding to the ordered connection at whose location a calibration signal is injected;
   inverting the second array and multiplying it times the second array to produce a third, transformation array;
   multiplying the measured test current areas for the first and second pairs of connections times the corresponding sub array of the transformation array to prior to computing the test current fractions; and
   using the reference device calibration current areas to instead of the test device calibration current areas to determine the calibration current fractions.

33. The method of claim 1, further comprising determining from the power signal measurements the location of said one or more defects so identified.

34. A system for testing an integrated circuit having a power grid and a plurality of ordered connections to the power grid, comprising:
- a probe for connecting to the die of an integrated circuit prior to final packaging, the probe including a power supply for the die;
- a data acquisition device, coupled to the probe, for applying transient input signals to the die and acquiring a plurality of die power signal measurements from respective ordered connections in response thereto; and
- a data processor, coupled to the data acquisition device, for determining whether a combination of two or more of the power signal measurements indicates the presence of a defect in the die.

35. The system of claim 34, wherein the data processor determines whether the integrated circuit is defective by identifying from the power signal measurements one or more potential power signal anomalies, and evaluating the power signal anomalies to determine whether they are due to a defect in the integrated circuit.

36. The system of claim 34, wherein the data processor determines the location of a defect based on the simultaneous solution of a plurality of parametric equations whose parameters include measured die power signals.

37. The system of claim 34, wherein the data acquisition device is adapted to acquire calibration power signals from the integrated circuit and the data processor is adapted to transform the power signal measurements to a reference device space using the calibration power signals so as to reduce the effects of probe connection contact resistance.

* * * * *